(12) United States Patent
Cheng et al.

(10) Patent No.: US 7,787,585 B2
(45) Date of Patent: Aug. 31, 2010

(54) SHIFT REGISTERS

(75) Inventors: Kuo-Hsing Cheng, Hsinchu (TW); Yao-Jen Hsieh, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/402,719

(22) Filed: Mar. 12, 2009

(65) Prior Publication Data
US 2009/0245455 A1    Oct. 1, 2009

(30) Foreign Application Priority Data
Mar. 27, 2008    (TW) .............................. 97110961 A

(51) Int. Cl.
*G11C 19/00*    (2006.01)
(52) U.S. Cl. .............................. 377/64; 377/68; 377/69
(58) Field of Classification Search .................. 377/64, 377/68–69, 77–79
See application file for complete search history.

(56) References Cited
U.S. PATENT DOCUMENTS

| | | | | |
|---|---|---|---|---|
| 7,420,536 B2 * | 9/2008 | Jang et al. | ................... | 345/100 |
| 7,436,923 B2 * | 10/2008 | Tobita | ......................... | 377/64 |
| 7,583,247 B2 * | 9/2009 | Park et al. | .................... | 345/100 |
| 7,636,412 B2 * | 12/2009 | Tobita | ......................... | 377/64 |
| 2004/0165692 A1 * | 8/2004 | Moon et al. | ................... | 377/64 |
| 2008/0101529 A1 * | 5/2008 | Tobita | ......................... | 377/64 |
| 2009/0041177 A1 * | 2/2009 | Chien et al. | ................... | 377/64 |

* cited by examiner

*Primary Examiner*—Tuan Lam
(74) *Attorney, Agent, or Firm*—Thomas, Kayden, Horstemeyer & Risley

(57) ABSTRACT

A shift register including shift register units controlled by first and second clock signals for generating an output signal. For each unit, in an active period, the first driving device drives the first switch device to activate the output signal, and the second driving device provides a voltage signal according to the first clock signal to drive the first switch device to deactivate the output signal. When the first switch device deactivates the output signal, the second switch device provides the voltage signal to serve as the output signal according to the second clock signal. In the active period, the voltage signal has a low level, and the first and second clock signals are set as alternating-current signals and are opposite to each other. In a blanking period, the voltage signal has a high level, and each of the first and second clock signals is set as a direct-current signal.

8 Claims, 7 Drawing Sheets

SHIFT REGISTERS

CROSS REFERENCE TO RELATED APPLICATIONS

This application claims the benefit of Taiwan application Serial No. 97110961 filed Mar. 27, 2008, the subject matter of which is incorporated herein by reference.

BACKGROUND OF THE INVENTION

1. Field of the Invention

The invention relates to a shift register, and more particularly to a control method for compensating for shifting of threshold voltage of transistors in the shift register.

2. Description of the Related Art

In current liquid crystal display panels, gate drivers and drain drivers are arranged to provide scan signals and data signals. In order to decrease costs, a shift register which has the same function as a gate driver is arranged in a glass panel. Most shift registers are formed by amorphous silicon thin-film processes. When a display panel is lit, transistors of a shift register in the display panel are affected by stress, and the display panel thus operates irregularly.

FIG. 1 shows a conventional shift register unit of a shift register. FIG. 2 is a timing chart of signals of the shift register unit in FIG. 1. Referring to FIGS. 1 and 2, a shift register unit 1 is controlled by clock signals CK and XCK opposite to each other, that is, the clock signals CK and XCK have inverse phases, and are coupled to a low voltage source Vss. The shift register unit 1 receives output signals $S_{N-1}$ and $S_{N+1}$ respectively from the previous shift register unit and the next shift register unit and generates an output signal $S_N$. At a time point P10, the output signal $S_{N-1}$ is activated, that is, the output signal $S_{N-1}$ is at a high level, and a transistor T10 is turned on. A voltage $V_{N10}$ at a node N10 is changed to a high level according to the output signal $S_{N-1}$ to turn on transistors T11 and T12. At this time, since the clock signal CK is at a low level and the transistor T12 is turned on, a voltage $V_{N11}$ at a node N11 is at a low level to turn off a transistor T13. A transistor T15 is turned on by the clock signal XCK with a high level, and the output signal $S_N$ is de-activated, that is, the output signal $S_N$ is at a low level.

At a time point P11, the output signal $S_{N-1}$ is de-activated, and the transistor T10 is turned off. The clock signal CK is changed to a high level. In the period between the time points P11 and P12, the clock signal CK with the high level couples to the node N10 through a capacitor C10 and the transistor T13, so that the voltage $V_{N10}$ at the node N10 is raised to a higher level according to the clock signal CK to turn on the transistors T11 and T12. According to the low voltage source Vss and the turned-on transistor T12, the voltage $V_{N11}$ at the node N11 remains at the low level to turn off the transistor T13. The clock signal CK with the high level is transmitted to an output node N12 through the turned-on transistor T11 to serve as the output signal $S_N$, in other words, the output signal $S_N$ is activated. The clock signal XCK with a low level turns off a transistor T15, and the voltage $V_{N11}$ with the low level turns off a transistor T16. Accordingly, the output signal $S_N$ can stably remain in the activated state.

At a time point P12, the clock signal CK is changed to a low level, and the output signal $S_{N+1}$ is activated to turn on the transistor T14. The voltage $V_{N10}$ at the node N10 is gradually decreased according to the low voltage source Vss to turn off the transistors T11 and T12. At this time, the clock signal XCK with a high level turns on the transistor T15, so that the voltage of the low voltage source Vss is provided to the output node N12 to serve as the output signal $S_N$, in other words, the output signal $S_N$ is de-activated.

At a time point P13, the clock signal CK is changed to a high level, and the voltage $V_{N11}$ at the node N11 is changed to a high level to turn on the transistor T13. Thus, the voltage N10 remains at a low level. Moreover, the voltage $V_{N11}$ with the high level turns on the transistor T16, so that the output signal $S_N$ remains in the de-activated state. After the time point P13, the shift register unit 1 operates according to the clock signal CK and XCK. The voltage $V_{N10}$ at the node N11 is switched between a high level and a low level.

It is assumed that the high level and the low level of the clock signal CK is 15V and −9V respectively, and the voltage of the low voltage source Vss is −7V. When the clock signal CK is at the high level to turn on the transistor T13, the voltage difference between a gate and a source of the transistor T13 is 22V. If the gate-source voltage Vgs of the transistor T13 is under positive base stress for a long time, the threshold voltage of the transistor T13 shifts, and the voltages $V_{N10}$ and $V_{N11}$ become irregular, as shown by the dotted line in $V_{N10}$ and $V_{N11}$ in FIG. 2. Similarly, if the gate-source voltages Vgs of the transistors T11, T12, and T14-16 are under positive base stress for a long time, their threshold voltages also shift. Thus, when the threshold voltages of the transistors in the shift register unit 1 shift, the shift register unit 1 operates irregularly and outputs an incorrect output signal $S_N$.

BRIEF SUMMARY OF THE INVENTION

An exemplary embodiment of a shift register operating in an active period and a blanking period is provided, comprising a plurality of substantially cascaded shift register units. Each of the shift register units is controlled by a first clock signal and a second clock signal for generating an output signal. The output signal is periodically activated. Each of the shift register units comprises first and second switch devices and first and second driving devices.

The first switch device provides the output signal through an output node. The first driving device drives the first switch device according to a first input signal to activate the output signal in the active period. The second driving device is coupled to a voltage signal and provides the voltage signal according to the first clock signal to drive the first switch device to de-activate the output signal in the active period. The second switch device is coupled to the voltage signal. When the first switch device de-activates the output signal, the second switch device provides the voltage signal to the output node according to the second clock signal. In the active period, the voltage signal is at a low level, and the first and second clock signals are set as alternating-current signals and are opposite to each other. In the blanking period, the voltage signal is at a high level, and each of the first and second clock signals is set as a direct-current signal.

Another exemplary embodiment of a shift register comprises substantially cascaded first, second, and third shift register units. Each of the first, second, and third shift register unit is controlled by a first clock signal and a second clock signal opposite to each other for generating an output signal. The output signal is periodically activated. Each of the first, second, and third shift register units comprises first and second switch devices and first and second devices.

The first switch device provides the output signal through an output node. The first driving device drives the first switch device according to a first input signal to activate the output signal. The second driving device is coupled to the second clock signal and provides the second clock signal according to the first clock signal to drive the first switch device to de-activate the output signal. The second switch device is coupled to the voltage signal. When the first switch device de-activates the output signal, the second switch device provides the voltage signal to the output node according to the second clock signal.

Another exemplary embodiment of a control method for a shift register is provided. The shift register operates in an active period and a blanking period and comprises a plurality of substantially cascaded shift register units. Each of the shift register units is controlled by a first clock signal and a second clock signal for generating an output signal. The output signal is periodically activated. Each of the shift register units comprises first and second switch devices and first and second driving devices. The first switch device provides the output signal through an output node. The second driving device and the second switch devices are coupled to a voltage signal. In the active period, the control method comprises: switching the voltage signal to a low level and setting the first and second clock signals as alternating-current signals, wherein the first and second are opposite to each other; driving the first switch device to activate the output signal by the first driving device according to a first input signal; providing the voltage signal to drive the first switch device to de-activate the output signal by the second driving device according to the first clock signal; and providing the voltage signal to the output node by the second switch device according to the second clock signal when the first switch device de-activates the output signal. In the blanking period, the control method comprises switching the voltage to a high level, and setting each of the first and second clock signals as a direct-current signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
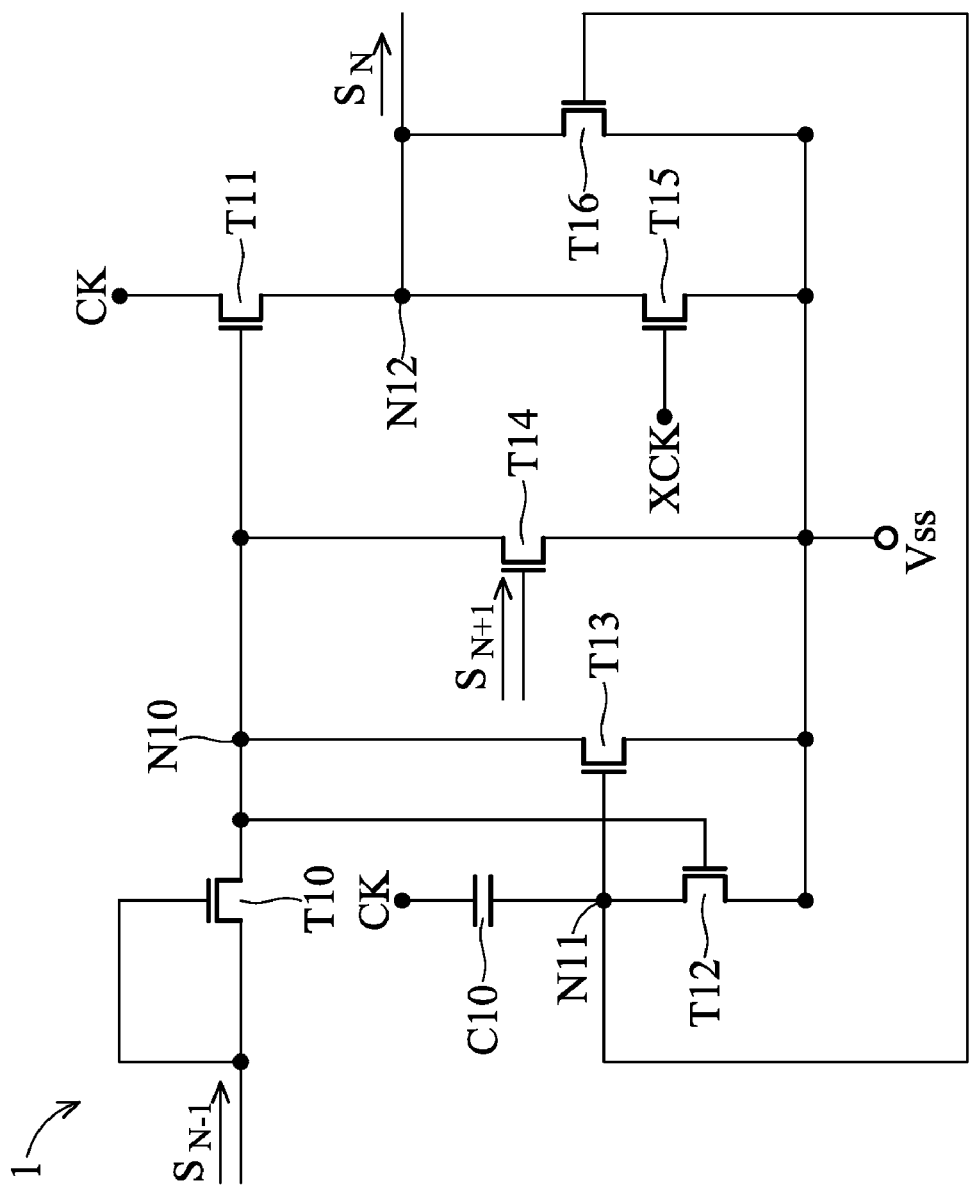
FIG. 1 shows a conventional shift register unit of a shift register.
Figure 2:
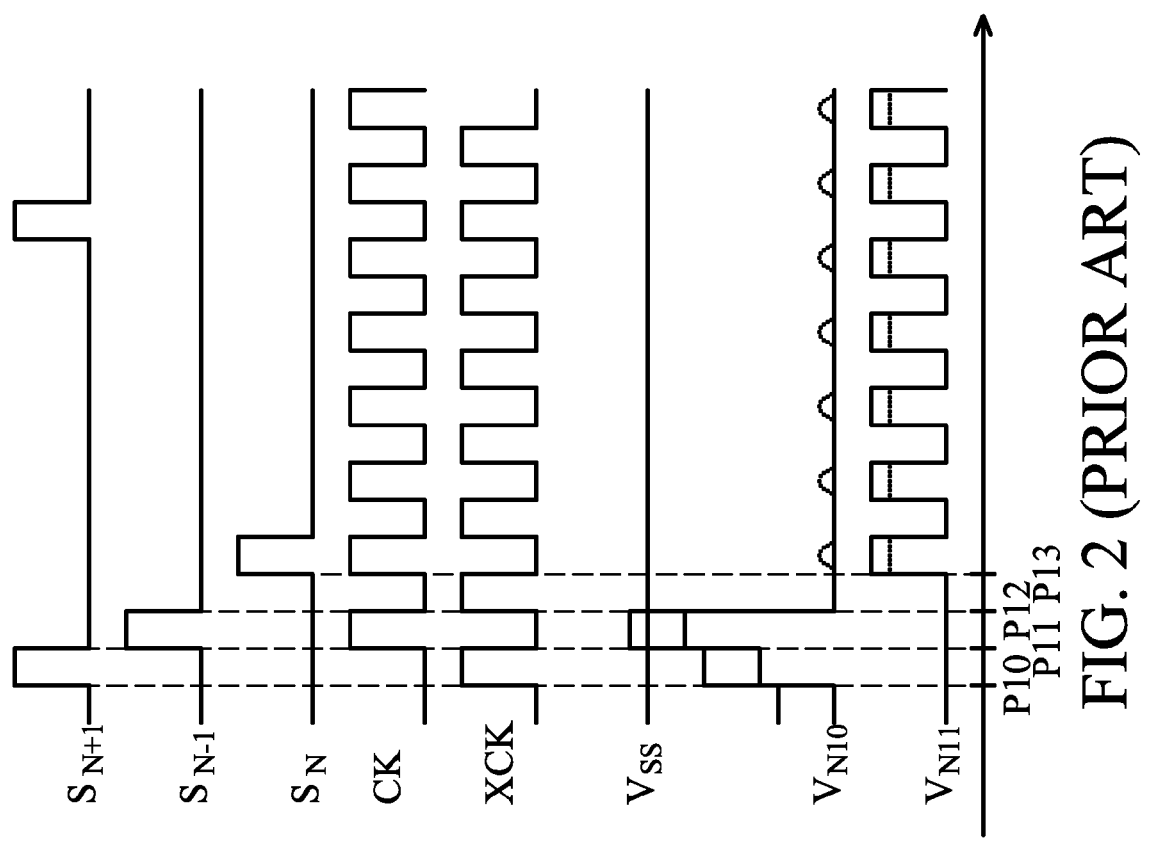
FIG. 2 is a timing chart of signals of the shift register unit in FIG. 1.
Figure 3:
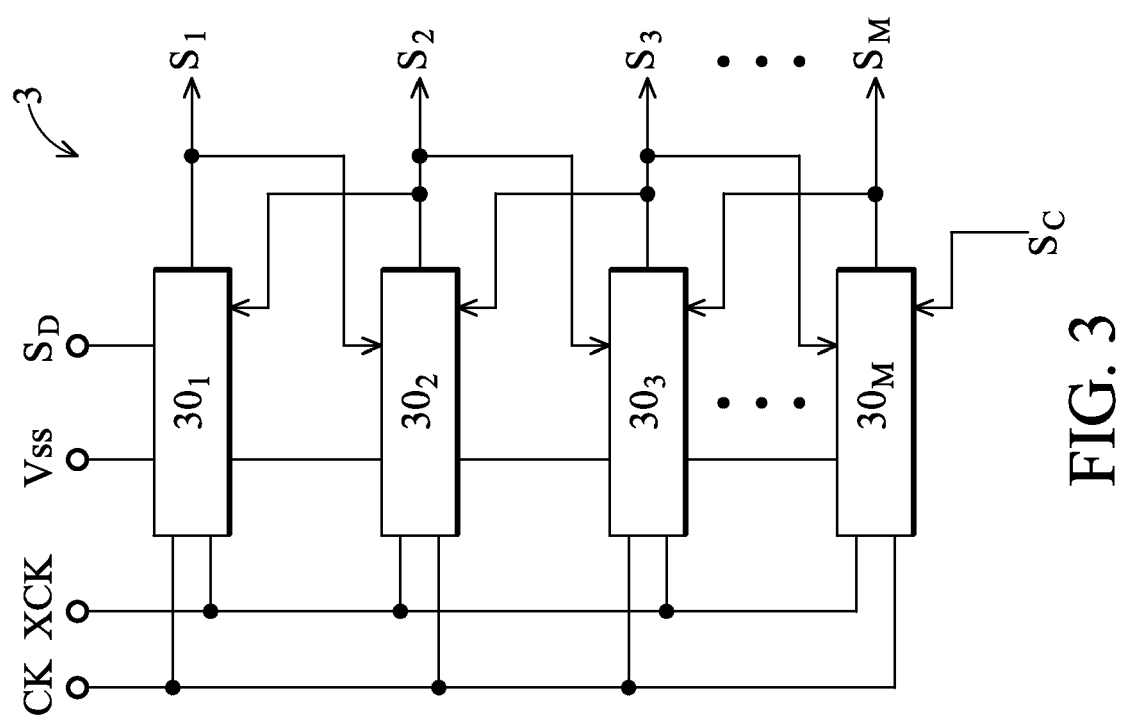
FIG. 3 shows an exemplary embodiment of a shift register.

Shift registers are provided. In an exemplary embodiment of a shift register in FIG. 3, a shift register 3 is applied in a liquid crystal display panel and operates an active period and a blanking period. Referring to FIG. 3, the shift register 3 comprises a plurality of substantially cascaded shift register units $30_1$-$30_M$. Each of the shift register units $30_1$-$30_M$ is controlled by clock signals CK and XCK and coupled to a voltage source. Each of the shift register units $30_1$-$30_M$ receives a first input signal and a second input signal and generates an output signal according to the clock signals CK and XCK. Output signals $S_1$-$S_M$ generated by the shift register units $30_1$-$30_M$ are substantially activated, and each of the output signals $S_1$-$S_M$ is periodically activated.

Each ($30_N$) of the shift register units $30_1$-$30_M$ receives an output signal $S_{N-1}$ generated by the previous shift register units $30_{N-1}$ to serve as the first input signal and an output signal $S_{N+1}$ generated by the next shift register units $30_{N+1}$ to serve as the second input signal, wherein 1<N<M, and N is an integer. The output signals $S_{N-1}$, $S_N$, and $S_{N+1}$ are substantially activated. For example, the shift register units $30_2$ receives the output signal $S_1$ generated by the previous shift register units $30_1$ and the output signal $S_3$ generated by the next shift register units $30_3$ and generates the output signal $S_2$. The output signal $S_2$ generated by the shift register units $30_2$ is received by the next shift register units $30_3$.

The shift register units $30_1$, which is the first stage of the shift register 3, receives the output signal $S_2$ from the shift register units $30_2$ to serve as the second input signal. The shift register units $30_1$ further receives a driving signal $S_D$ generated by an external or internal circuit to serve as the first input signal. The driving signal $S_D$, the output signal $S_1$, and the output signal $S_2$ are substantially activated. Similarly, the shift register units $30_M$, which is the last stage of the shift register 3, receives the output signal $S_{M-1}$ from the shift register units $30_{M-1}$ to serve as the first input signal. The shift register units $30_{M-1}$ further receives a control signal $S_C$ generated by an external or internal circuit to serve as the second input signal. The output signal $S_{M-1}$, the output signal $S_M$, and the control signal $S_C$ are substantially activated.

Figure 4:
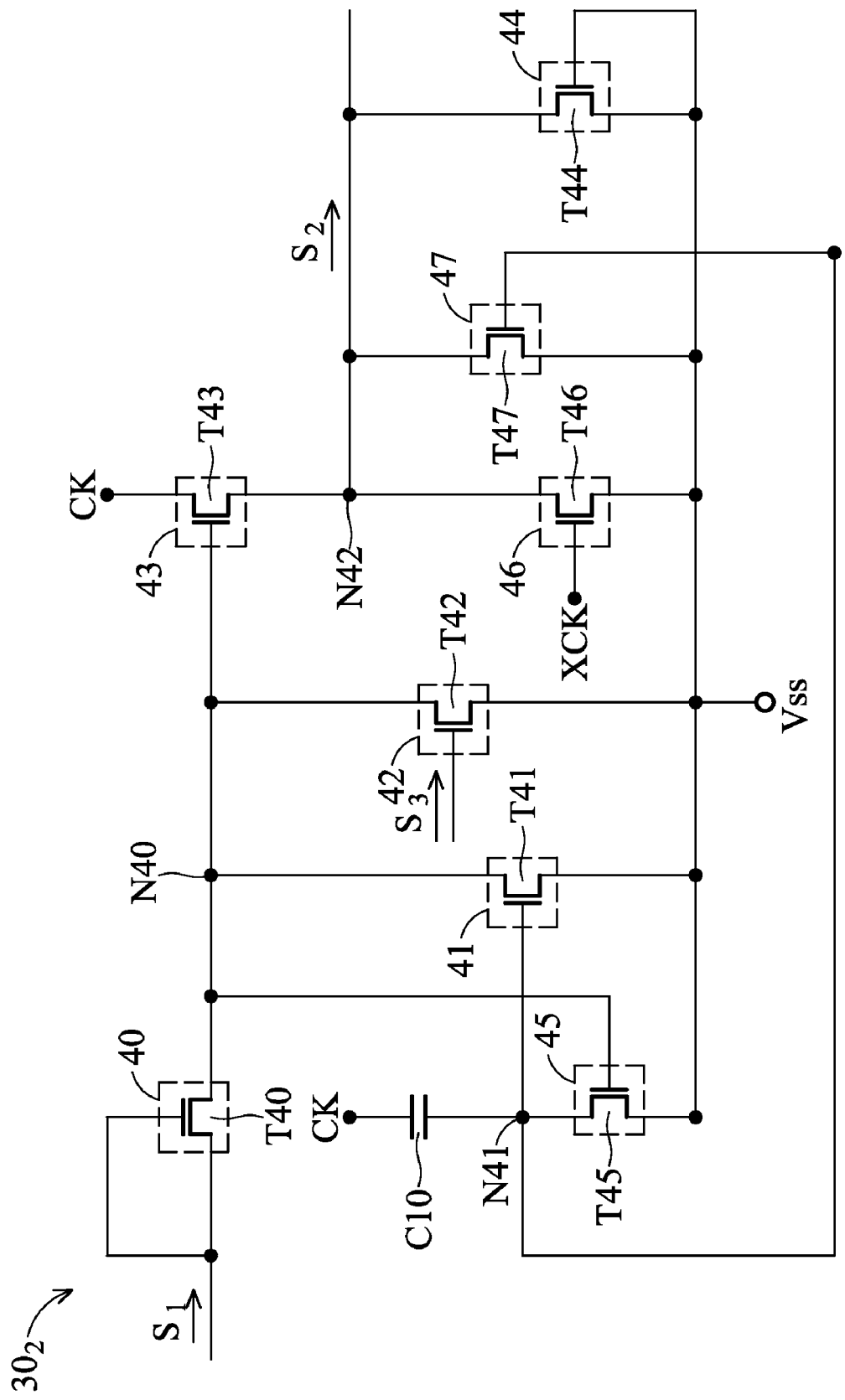
FIG. 4 shows an exemplary embodiment of a shift register unit.

FIG. 4 shows an exemplary embodiment of a shift register unit. In the embodiment in FIG. 4, the shift register unit $30_2$ of the shift register 3 is given as an example for description, and the other shift register units $30_1$ and $30_3$-$30_M$ have the same circuitry as the shift register units $30_2$. The shift register units $30_2$ receives the output signal $S_1$ generated by the previous shift register units $30_1$ to serve as the first input signal and the output signal $S_3$ generated by the next shift register units $30_3$ serve as the second input signal.

Figure 5:
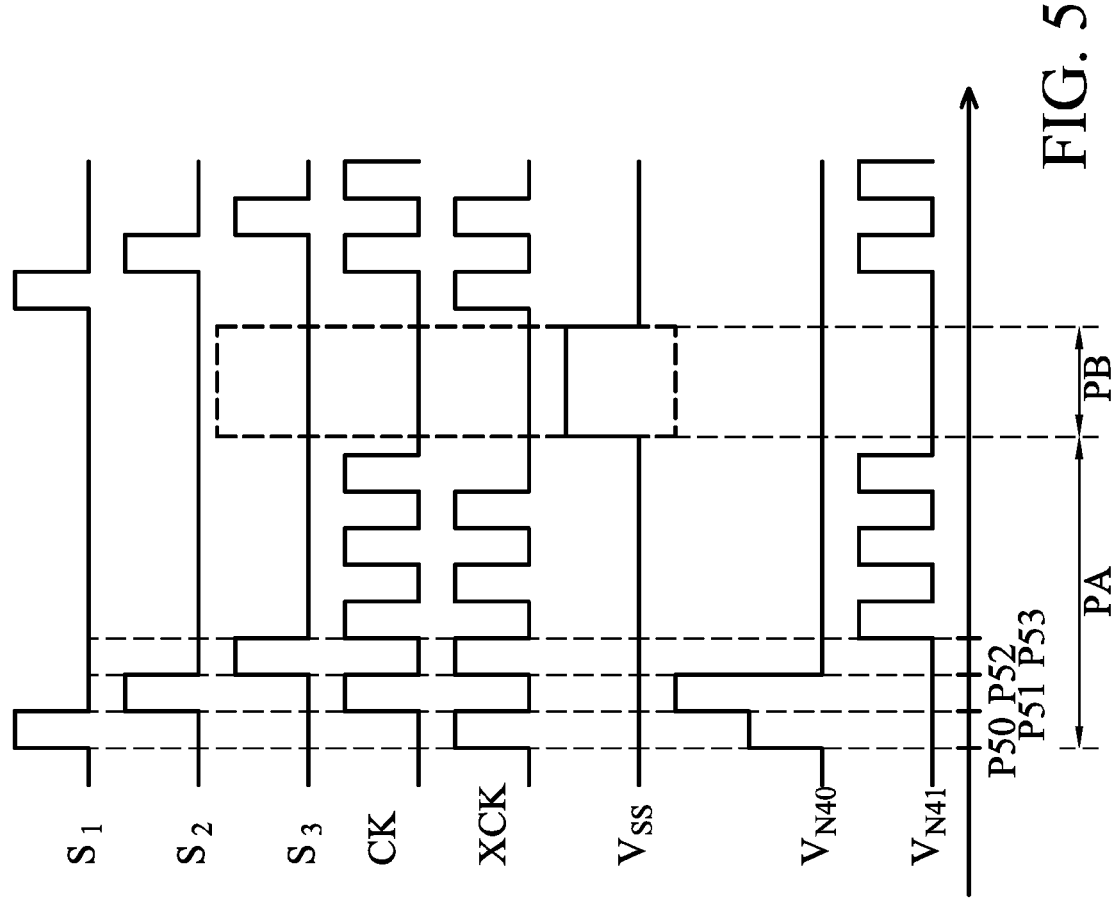
FIG. 5 is a timing chart of signals of the shift register unit in FIG. 4.

The shift register unit $30_2$ comprises driving devices 40-42, switch devices 43-47, and a capacitor C40. In the embodiment, the driving devices 40-42 and the switch devices 43-47 are implemented respectively by NMOS transistors T40-T42 and T43-T47. Sources of the transistors T42 and T44-T47 are coupled to a voltage source Vss. In the following description, a signal state at a high level indicates that the signal is activated, while a signal state at a low level indicates that the signal is de-activated. FIG. 5 is a timing chart of signals of the shift register unit in FIG. 4. The shift register unit $30_2$ operates an active period PA and a blanking period PB. In the active period PA, the voltage source Vss provides a low-level voltage signal, and the clock signals CK and XCK are alternating-current signals and are opposite to each other, that is, the clock signals CK and XCK have inverse phases. In the blanking period PB, the voltage source Vss is changed to provide a high-level voltage signal, and the clock signals CK and XCK are changed to direct-current signals with a low level. The detailed operation of the shift register unit $30_2$ is described in following.

At a time point P50 in the active period PA, the output signal $S_1$ is changed to a high level, and a transistor T40 is turned on. A voltage $V_{N40}$ at a node N40 is changed to a high level according to the output signal $S_1$ to turn on transistors T43 and T45. At this time, since the clock signal CK is at a low level and the transistor T45 is turned on, a voltage $V_{N41}$ at a node N41 is at the low level to turn off a transistor T41. A transistor T46 is turned on by the clock signal XCK with a high level, so that the output signal $S_2$ is at a low level, that is, the output signal $S_2$ is de-activated.

At a time point P51 in the active period PA, the output signal $S_1$ is changed to a low level, and the transistor T40 is turned off. The clock signal CK is changed to a high level. Between the time points P51 and P52, the clock signal CK with the high level couples to the node N40 through a capacitor C40 and the transistor T41, so that the voltage $V_{N40}$ at the node N40 is raised to a higher level according to the clock signal CK to turn on the transistors T43 and T45. A low-level voltage signal provided by the voltage source Vss is transmitted to the node N41 to turn off the transistor T41, that is, the transistor T41 is disabled. The clock signal CK with the high level is transmitted to an output node N42 through the turned-on transistor T43 to serve as the output signal $S_2$, in other words, the output signal $S_1$ is activated by the transistor T43. The low-level voltage signal provided by the voltage source Vss is transmitted to the node N41, and voltage $V_{N41}$ remains at the low level to turn off the transistor T47. The clock signal XCK with a low level turns off the transistor T46. Accordingly, the output signal $S_1$ can stably remain in the activated state.

At a time point P52 in the active period PA, the clock signal CK is changed to the low level, and the output signal $S_3$ is activated to turn on the transistor T42. The voltage $V_{N40}$ at the node N40 is gradually decreased according to the low-level voltage signal of the voltage source Vss to turn off the transistors T43 and T45, so that the transistor T43 does not activate the output signal $S_2$. At this time, the clock signal XCK with the high level turns on the transistor T46, so that the low-level voltage signal of the voltage source Vss is provided to the output node N42 to serve as the output signal $S_2$, in other words, the output signal $S_2$ is de-activated.

At a time point P53 in the active period PA, the clock signal CK is changed to the high level, and the voltage $V_{N41}$ at the node N41 is changed to a high level to turn on the transistor T41. The low-level voltage signal of the voltage source Vss is coupled to the node N40 through the turned-on transistor T41. Thus, the voltage $V_{N40}$ at the node N40 remains at a low level to turn off the transistor T43, so that the transistor T43 does not activate the output signal $S_2$. Moreover, the voltage $V_{N41}$ with the high level turns on the transistor T46, and the low-level voltage signal of the voltage source Vss is provided to the output node N42 to serve as the output signal $S_2$. Thus, the output signal $S_2$ remains in the de-activated state. In the active period and after the time point P53, the shift register unit $30_2$ operates according to the clock signal CK and XCK. The voltage $V_{N41}$ at the node N41 is switched between a high level and a low level.

It is assumed that the high level and the low level of the clock signal CK is 15V and −9V, respectively, and the voltage signal of the voltage source Vss1 is −7V. In the active period PA, when the clock signal CK is at a high level to turn on the transistor T41, the voltage difference between a gate and a source of the transistor T41 is 22V, that is, the gate-source voltage Vgs of the transistor T41 is under large positive base stress. Similarly, the gate-source voltages Vgs of the transistors T42, T43, and T45-T47 are also under large positive base stress. The large positive base stress results in the shifting of the threshold voltages of these transistors.

In the blanking period PB, the output signals $S_1$-$S_3$ are at a low level, and the clock signals CK and XCK are changed to direct-current signals with a low level. Particularly, in the blanking period PB, the voltage signal provided by the voltage source Vss is at the same level as the high level of the clock signal CK in the active period PA. Thus, the gate-source voltage Vgs of the transistor T41 is under a negative base stress in the blanking period PB, which induces compensation for the shifting of the threshold voltage of the transistor T41. Similarly, in the blanking period PB the gate-source voltages Vgs of the transistors T42, and T45-T47 are also under a negative base stress for compensation for the shifting of the threshold voltage of the transistors.

In this embodiment, a gate and a source of the transistor T44 are coupled to the voltage source Vss. In the blanking period PB, the high-level voltage signal of the voltage source Vss turns on the transistor T44, so that the output node N42 is at a high level. Thus, the gate-source voltage Vgs of the transistor T43 is under a negative base stress for compensation for the shifting of the threshold voltage.

Figure 6:
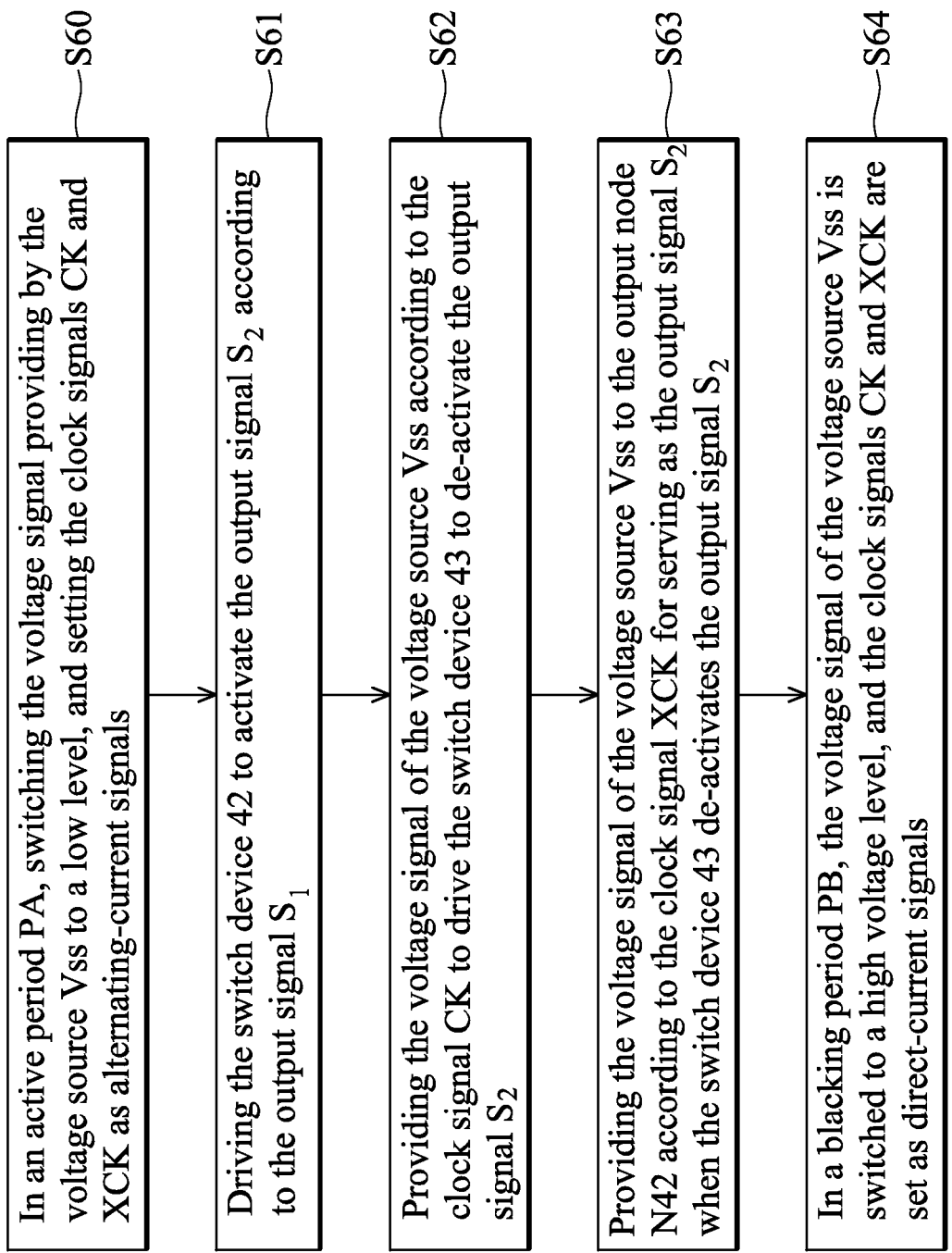
FIG. 6 is a flow chart of an exemplary embodiment of a control method for a shift register.

FIG. 6 is a flow chart of an exemplary embodiment of a control method for a shift register. The control method is described according to FIGS. 4-6. In an active period PA, the voltage signal provided by the voltage source Vss is switched to a low level, and the clock signals CK and XCK are set as alternating-current signals (step S60). The driving device 40 drives the switch device 42 to activate the output signal $S_2$ according to the output signal $S_1$ (step S61). The driving device 41 provides the voltage signal of the voltage source Vss according to the clock signal CK to drive the switch device 43 to de-activate the output signal $S_2$ (step s62). When the switch device 43 de-activates the output signal $S_2$, the switch device 46 provides the voltage signal of the voltage source Vss to the output node N42 according to the clock signal XCK for serving as the output signal $S_2$ (step S63). In a blanking period PB, the voltage signal of the voltage source Vss is switched to a high voltage level, and the clock signals CK and XCK are set as direct-current signals with a low level (step S64).

Figure 7:
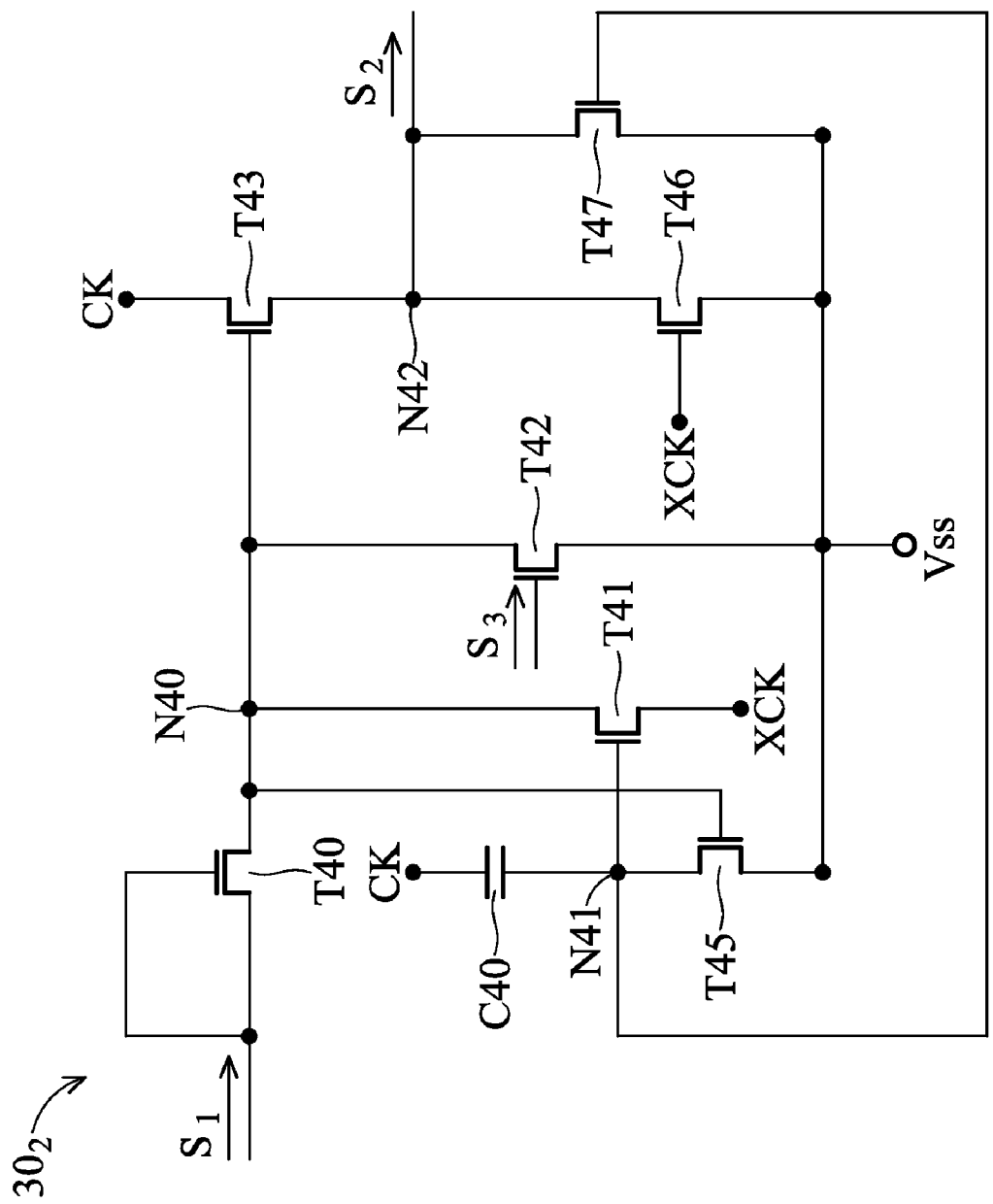
FIG. 7 shows another exemplary embodiment of a shift register unit.

FIG. 7 shows another exemplary embodiment of a shift register unit. In the embodiment in FIG. 7, the shift register unit $30_2$ of the shift register 3 is given as an example for description. In FIGS. 4 and 7, the same elements and the same signals are represented by the same labels. Referring to FIGS. 4 and 7, a majority of the element connections and the signal timings are the same. One difference between FIGS. 4 and 7 is that the shift register of FIG. 7 does not comprise the switch device 44. Another difference is that the sources of the transistors T41, T42, and T45-T47 of FIG. 4 are coupled to the voltage source Vss, while the source of the transistor T41 of FIG. 7 is coupled to the clock signal XCK and not the voltage source Vss. Moreover, the voltage signal provided by the voltage source Vss is at a low level and is not changed to a high level. When the transistor T41 is turned on according to the clock signal CK, the clock signal XCK is transmitted to the node N41 to turn off the transistor T43, so that the transistor T43 does not de-activate the output signals $S_2$.

The source of the transistor T41 is coupled to the clock signal XCK, and the gate thereof is coupled to the clock signal CK. Thus, in the active period, the gate-source voltage Vgs of the transistor T41 is alternately under a positive base stress and a negative base stress, reducing the effect from the shifting of the threshold voltage of the transistor T41.

According to the embodiments, the shifting of the threshold voltages of transistors, which resulted from a positive base stress, can be reduced by a negative base stress on the transistors.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift register operating in an active period and a blanking period, comprising
a plurality of substantially cascaded shift register units, each controlled by a first clock signal and a second clock signal for generating an output signal, wherein the output signal is periodically activated, and each of the shift register units comprises:
a first switch device for providing the output signal through an output node;
a first driving device for driving the first switch device according to a first input signal to activate the output signal in the active period;
a second driving device, coupled to a voltage signal, for providing the voltage signal according to the first clock signal to drive the first switch device to de-activate the output signal in the active period; and
a second switch device, coupled to the voltage signal, for providing the voltage signal to the output node according to the second clock signal when the first switch device de-activates the output signal,
wherein in the active period, the voltage signal is at a low level, and the first and second clock signals are set as alternating-current signals and are opposite to each other, and
wherein in the blanking period, the voltage signal is at a high level, and each of the first and second clock signals is set as a direct-current signal.

2. The shift register as claimed in claim 1,
wherein each of the shift register units further comprises a third driving device, coupled to the voltage signal, for driving the first switch device to de-activate the output signal by the voltage signal according to a second input signal, and
wherein each of the first and second input signals is periodically activated, and the first input signal, the output signal, and the second input signal are substantially activated.

3. The shift register as claimed in claim 2, wherein the plurality of shift register units comprises first, second, and third substantially cascaded shift register units, the output signal of the first shift register unit serves as the first input signal of the second shift register unit, the output signal of the second shift register unit serves as the first input signal of the third shift register unit and the second input signal of the first shift register, and the output signal of the third shift register unit serves as the second input signal of the second shift register unit.

4. The shift register as claimed in claim 1, wherein each of the shift register units further comprises a third switch device, coupled to the voltage signal, for providing the voltage signal to the output node according to the first clock signal when the first switch device de-activates the output signal.

5. The shift register as claimed in claim 1, wherein each of the shift register units further comprises a fourth switch device, coupled to the voltage signal, for disabling the second driving device by the voltage signal when the first driving device drives the first switch device to activate the output signal.

6. The shift register as claimed in claim 1, wherein each of the shift register units further comprises a fifth switch device, coupled to the voltage signal, for providing the voltage signal to the output signal in the blanking period.

7. The shift register as claimed in claim 1, wherein the plurality of shift register units comprises first, second, and third substantially cascaded shift register units, the output signal of the first shift register unit serves as the first input signal of the second shift register unit, and the output signal of the second shift register unit serves as the first input signal of the third shift register unit.

8. A control method for a shift register operating in an active period and a blanking period and comprising a plurality of substantially cascaded shift register units, wherein each of the shift register units are controlled by a first clock signal and a second clock signal for generating an output signal, the output signal is periodically activated, each of the shift register units comprise first and second switch devices and first and second driving devices, the first switch device provides the output signal through an output node, and the second driving device and the second switch devices are coupled to a voltage signal, comprising:
in the active period:
switching the voltage signal to a low level and setting the first and second clock signals as alternating-current signals, wherein the first and second are opposite to each other;
driving the first switch device to activate the output signal by the first driving device according to a first input signal;
providing the voltage signal to drive the first switch device to de-activate the output signal by the second driving device according to the first clock signal; and
providing the voltage signal to the output node by the second switch device according to the second clock signal when the first switch device de-activates the output signal; and
in the blanking period:
switching the voltage to a high level, and setting each of the first and second clock signals as a direct-current signal.

* * * * *